(12) United States Patent
Scholz et al.

(10) Patent No.: US 9,847,467 B2
(45) Date of Patent: Dec. 19, 2017

(54) OPTOELECTRONIC COMPONENT AND METHOD FOR THE PRODUCTION THEREOF

(71) Applicant: OSRAM Opto Semiconductors GmbH, Regensburg (DE)

(72) Inventors: Dominik Scholz, Regensburg (DE); Norwin von Malm, Thumhausen/Nittendorf (DE); Stefan Illek, Donaustauf (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/030,652

(22) PCT Filed: Oct. 27, 2014

(86) PCT No.: PCT/EP2014/073014
§ 371 (c)(1),
(2) Date: Apr. 20, 2016

(87) PCT Pub. No.: WO2015/063034
PCT Pub. Date: May 7, 2015

(65) Prior Publication Data
US 2016/0247990 A1    Aug. 25, 2016

(30) Foreign Application Priority Data

Oct. 28, 2013 (DE) .................. 10 2013 221 788

(51) Int. Cl.
*H01L 33/62* (2010.01)
*H01L 25/16* (2006.01)
*H01L 33/00* (2010.01)

(52) U.S. Cl.
CPC ............ *H01L 33/62* (2013.01); *H01L 25/167* (2013.01); *H01L 33/0079* (2013.01);
(Continued)

(58) Field of Classification Search
CPC . H01L 33/62; H01L 33/0079; H01L 33/0095; H01L 25/167; H01L 2924/0002;
(Continued)

(56) References Cited

U.S. PATENT DOCUMENTS 8,780,023 B2   7/2014   Ootorii
2005/0000634 A1*   1/2005   Craig ............... G06K 19/07718
                                                                       156/230
(Continued)

FOREIGN PATENT DOCUMENTS

DE    10 2007 030 129 A1    1/2009
DE    10 2009 053 064 A1    5/2011
(Continued)

OTHER PUBLICATIONS

Notice of Reasons for Rejection dated Jul. 4, 2017 of corresponding Japanese Application No. 2016-526848 in English.

*Primary Examiner* — Yu Chen
*Assistant Examiner* — Scott Bauman
(74) *Attorney, Agent, or Firm* — DLA Piper LLP (US)

(57) ABSTRACT

A method of producing a contact element for an optoelectronic component includes providing an auxiliary carrier with a sacrificial layer arranged on a top side of the auxiliary carrier; providing a carrier structure having a top side and a rear side situated opposite the top side, wherein an insulation layer is arranged at the rear side of the carrier structure; connecting the sacrificial layer to the insulation layer by an electrically conductive connection layer; creating at least one blind hole extending from the top side of the carrier structure as far as the insulation layer; opening the insulation layer in a region of the at least one blind hole; arranging an electrically conductive material in the at least one blind hole;

(Continued)

detaching the auxiliary carrier by separating the sacrificial layer; and patterning the electrically conductive connection layer.

18 Claims, 10 Drawing Sheets

(52) U.S. Cl.
CPC .. *H01L 33/0095* (2013.01); *H01L 2924/0002* (2013.01); *H01L 2933/0066* (2013.01)

(58) Field of Classification Search
CPC ....... H01L 2933/0066; H01L 23/49827; H01L 21/486; H01L 21/76898; H01L 23/481; H01L 23/5226; H01L 23/5384
USPC .......................................................... 257/99
See application file for complete search history.

(56) References Cited

U.S. PATENT DOCUMENTS

| | | | | |
|---|---|---|---|---|
| 2008/0044984 | A1* | 2/2008 | Hsieh | ................... H01L 21/304 438/459 |
| 2010/0124798 | A1* | 5/2010 | Kim | ................... H01L 33/0079 438/34 |
| 2010/0276706 | A1 | 11/2010 | Herrmann | |
| 2011/0136271 | A1* | 6/2011 | von Malm | .......... H01L 33/0079 438/15 |
| 2012/0168792 | A1* | 7/2012 | Kang | .................... H01L 33/486 257/94 |
| 2012/0220063 | A1 | 8/2012 | Seong | |
| 2012/0223416 | A1* | 9/2012 | Scheubeck | ............ H01L 25/167 257/603 |
| 2013/0032845 | A1 | 2/2013 | Chuang et al. | |
| 2013/0264707 | A1* | 10/2013 | Lee | ..................... H01L 23/5384 257/737 |
| 2013/0292735 | A1 | 11/2013 | Höppel | |
| 2014/0147987 | A1 | 5/2014 | Zhao et al. | |
| 2016/0189995 | A1* | 6/2016 | Gondcharton | ...... H01L 21/6835 438/107 |
| 2017/0263497 | A1* | 9/2017 | Yamazaki | ......... H01L 21/76861 |

FOREIGN PATENT DOCUMENTS

| | | |
|---|---|---|
| DE | 10 2009 056 386 A1 | 6/2011 |
| DE | 10 2010 054 898 A1 | 6/2012 |
| EP | 1 306 899 A1 | 5/2003 |
| EP | 2 262 012 A2 | 12/2010 |
| EP | 2 393 127 A1 | 12/2011 |
| JP | 2012-227514 | 11/2012 |
| WO | 2012/155535 A1 | 11/2012 |
| WO | 2013/057668 A1 | 4/2013 |

\* cited by examiner

OPTOELECTRONIC COMPONENT AND METHOD FOR THE PRODUCTION THEREOF

TECHNICAL FIELD

This disclosure relates to a method of producing a contact element for an optoelectronic component, a method of producing an optoelectronic component, and an optoelectronic component.

BACKGROUND

Optoelectronic thin-film chips in which an optoelectronic semiconductor layer sequence is detached from a substrate after production are known. By way of example, thin-film light-emitting diode chips are known. Such optoelectronic thin-film chips are arranged on a carrier system connecting metallic contact pads of the active semiconductor layer sequence via conductive through contacts to external contact pads at the underside of the carrier system. Such carrier systems are made very thin to enable an effective thermal coupling of the semiconductor layer sequence. However, the combination of the thin optoelectronic semiconductor layer sequence with the thin carrier system is mechanically so fragile that processing in the wafer assemblage is not possible.

It could therefore be helpful to provide a method of producing a contact element for an optoelectronic component, a method of producing an optoelectronic component and an optoelectronic component.

SUMMARY

We provide a method of producing a contact element for an optoelectronic component including providing an auxiliary carrier with a sacrificial layer arranged on a top side of the auxiliary carrier; providing a carrier structure having a top side and a rear side situated opposite the top side, wherein an insulation layer is arranged at the rear side of the carrier structure; connecting the sacrificial layer to the insulation layer by an electrically conductive connection layer; creating at least one blind hole extending from the top side of the carrier structure as far as the insulation layer; opening the insulation layer in a region of the at least one blind hole; arranging an electrically conductive material in the at least one blind hole; detaching the auxiliary carrier by separating the sacrificial layer; and patterning the electrically conductive connection layer.

We also provide a method of producing an optoelectronic component including producing a contact element before detaching the auxiliary carrier, providing a substrate with an optoelectronic semiconductor structure arranged at a top side of the substrate; arranging the optoelectronic semiconductor structure at the top side of the carrier structure; and detaching the substrate.

We further provide an optoelectronic component including a contact element having a carrier structure having a top side and a rear side situated opposite the top side, wherein at least one through contact opening extends between the top side and the rear side through the carrier structure, an insulation layer is arranged at the rear side, an electrically conductive material is arranged in the through contact opening, a solder metal is arranged at the rear side, the solder metal electrically conductively connected to the electrically conductive material, and a surface of the solder metal facing the insulation layer and the electrically conductive material is formed in a manner free of steps.

LIST OF REFERENCE SIGNS

Figure 1:
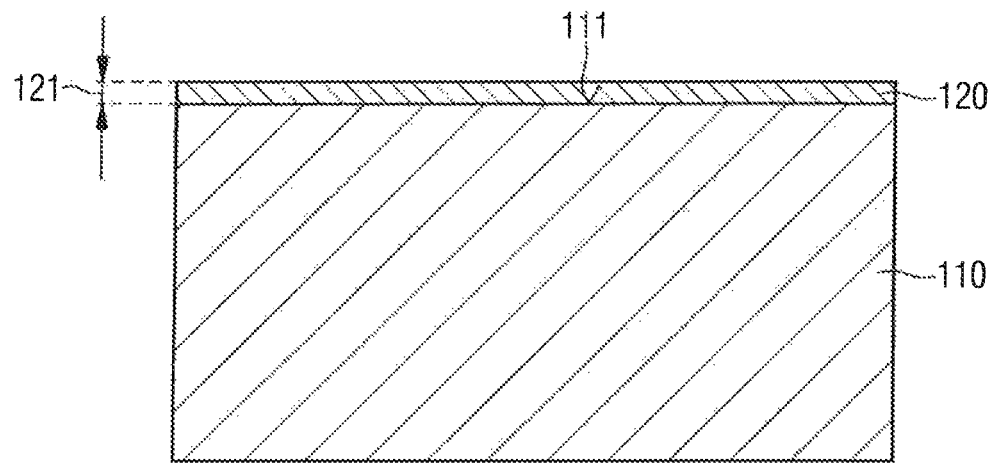
FIG. 1 shows a sectional side view of an auxiliary carrier with a sacrificial layer.

10 Optoelectronic component
20 Optoelectronic component
100 Contact element
110 Auxiliary carrier
111 Top side
120 Sacrificial layer
121 Thickness
122 Laser beam
123 Channel
124 Etching medium
130 Carrier structure
131 Top side
132 Rear side
133 Thickness
140 Insulation layer
141 Further insulation layer
145 Opening
150 Electrically conductive connection layer
151 First section
152 Second section
153 First soldering contact pad
154 Second soldering contact pad
160 Blind hole
161 First blind hole 162 Second blind hole
165 Inner wall
170 Electrically conductive material
171 First through contact
172 Second through contact
173 First contact region
174 Second contact region
200 Optoelectronic semiconductor structure
201 Thickness
210 Substrate
211 Top side
220 n-doped layer
221 Radiation emission face
230 p-doped layer
231 Rear side
240 First contact pad
250 Second contact pad
260 Second insulation layer
300 Integrated protective diode
301 First contact
302 Second contact

DETAILED DESCRIPTION

Our method of producing a contact element for an optoelectronic component comprises providing an auxiliary carrier with a sacrificial layer arranged on a top side of the auxiliary carrier, providing a carrier structure having a top side and a rear side situated opposite the top side, wherein an insulation layer is arranged at the rear side of the carrier structure to connect the sacrificial layer to the insulation layer by an electrically conductive connection layer, create at least one blind hole extending from the top side of the carrier structure as far as the insulation layer, open the insulation layer in the region of the at least one blind hole, arrange an electrically conductive material in the at least one blind hole, detach the auxiliary carrier by separating the sacrificial layer, and pattern the electrically conductive connection layer.

Advantageously, the insulation layer can serve as an etching stop layer during the process of creating the blind hole as a result of which the blind hole can be created with a very accurately defined depth. As a result, advantageously, no further steps of opening a blind hole possibly not formed with a sufficient depth are necessary. As a result, mechanical loads associated with such a processing step, for example, a grinding-back process are advantageously omitted as well. A further advantage is that the electrically conductive connection layer can serve as an electrical contact layer in the contact element obtainable by the method. Advantageously, the contact element is mechanically stabilized by the auxiliary carrier while this method is being carried out, as a result of which the method can be carried out simply and cost-effectively and also in the wafer assemblage.

The auxiliary carrier and the carrier structure may be provided in the form of wafers. Advantageously, the method therefore enables parallel production of a multiplicity of contact elements in a common work operation. As a result, the production costs per individual contact element can advantageously be reduced drastically.

The auxiliary carrier may comprise sapphire or silicon. In an auxiliary carrier comprising sapphire, the auxiliary carrier is advantageously optically transparent which enables the auxiliary carrier to be easily detached. One advantage of the method is that, after being detached, the auxiliary carrier can be reused when the method is carried out again, as a result of which the costs required to carry out the method decrease.

The carrier structure may comprise silicon. Advantageously, the carrier structure is obtainable cost-effectively as a result and can be processed by established methods of semiconductor processing.

The sacrificial layer may comprise gallium nitride (GaN) or silicon nitride (SiN). Advantageously, these materials enable the sacrificial layer to be easily separated to detach the auxiliary carrier.

The sacrificial layer and the insulation layer may connect by eutectic bonding. Advantageously, the method thereby allows simple, cost-effective production of a mechanically robust connection between the sacrificial layer and the insulation layer. A further advantage is that the electrically conductive connection layer—arising during production of the eutectic bonding connection—between the sacrificial layer and the insulation layer can serve as an electrical contact layer on the finished contact element.

After connecting the sacrificial layer to the insulation layer, a step may be carried out to thin the carrier structure proceeding from the top side of the carrier structure. Advantageously, the carrier structure in this case can first be formed as a thick layer which simplifies production of the connection between the sacrificial layer connected to the auxiliary carrier and the insulation layer connected to the carrier structure. This makes it possible, for example, to provide the auxiliary carrier and the carrier structure in wafer form. Since the auxiliary carrier provides a sufficient mechanical stabilization after the process of producing the connection between the sacrificial layer and the insulation layer, the carrier structure can advantageously be thinned after the process of connecting the sacrificial layer to the insulation layer.

The carrier structure may be thinned to a thickness of less than 200 μm, preferably to a thickness of less than 150 μm. Advantageously, the method therefore makes it possible to produce a very thin contact element for an optoelectronic component.

Before opening the insulation layer in the region of the at least one blind hole, a further step may be carried out to form a further insulation layer at an inner wall of the blind hole and at the top side of the carrier structure. Advantageously, this ensures an electrical insulation between the electrically conductive material arranged in the blind hole and electrically conductive material arranged in further blind holes, even if the material of the carrier structure itself is not embodied in an electrically insulating fashion.

Separating the sacrificial layer may be carried out by an etching process or by a laser beam. Both variants advantageously enable the sacrificial layer to be separated simply and reliably, which enables the auxiliary carrier to be detached.

The electrically conductive connection layer may be patterned such that sections of the electrically conductive connection layer that are electrically insulated from one another arise. The sections of the electrically conductive connection layer that are insulated from one another can thereby serve as electrical contact layers in the contact element obtainable by the method. As a result, the method requires no additional work step to apply further electrically conductive contact layers.

After patterning the electrically conductive connection layer, a further step may be carried out to apply at least one soldering contact pad to the electrically conductive connection layer. The soldering contact pad applied in this method step can make it possible, for example, for the contact element obtainable by the method to be electrically contacted by a method of surface mounting. The contact element obtainable by the method can then produce an SMD component.

Our method of producing an optoelectronic component comprises steps of producing a contact element according to a method of the type mentioned above. In this case, before detaching the auxiliary carrier, additional further steps are carried out to provide a substrate with an optoelectronic semiconductor structure arranged at a top side of the substrate, arrange the optoelectronic semiconductor structure at the top side of the carrier structure, and detach the substrate. By the method steps, the optoelectronic semiconductor structure thus connects to the contact element as a result of which the contact element in the optoelectronic component obtainable by the method, can provide external electrical contacts for the optoelectronic semiconductor structure. In this case, the substrate can advantageously first mechanically stabilize the optoelectronic semiconductor structure. After the process of arranging the optoelectronic semiconductor structure at the top side of the carrier structure of the contact element, the auxiliary carrier affords a sufficient mechanical stabilization, thereby enabling the substrate to be detached.

The substrate may be provided in the form of a wafer. Advantageously, the method thereby enables parallel production of a multiplicity of optoelectronic components in a common work operation. As a result, the production costs per individual optoelectronic component advantageously decrease significantly. Processing of a complete wafer is advantageously made possible in this method by the fact that a sufficient mechanical stability is ensured by the auxiliary carrier and the substrate at all points in time during production of the optoelectronic component.

The optoelectronic semiconductor structure may be provided with a thickness of less than 20 μm, preferably with a thickness of less than 10 μm. Advantageously, the method thereby makes it possible to produce an optoelectronic component having a very small thickness.

The optoelectronic semiconductor structure may be arranged at the top side of the carrier structure by eutectic bonding. Advantageously, eutectic bonding enables a simple, cost-effective and reliable connection between the optoelectronic semiconductor structure and the top side of the carrier structure. In this case, electrically conductive connections advantageously arise which make it possible for electrical contacts of the optoelectronic semiconductor structure to electrically conductively connect to through contacts of the carrier structure.

The latter may comprise a further step of dividing the carrier structure and the optoelectronic semiconductor structure to obtain a plurality of optoelectronic components. Advantageously, the method thereby enables parallel production of a multiplicity of optoelectronic components as a result of which the production costs of the individual optoelectronic component can drastically decrease.

The carrier structure may be provided with an integrated protective diode. In the optoelectronic component obtainable by the method, the protective diode can serve for protection against damage to the optoelectronic component resulting from electrostatic discharges. The protective diode integrated into the carrier structure advantageously obviates the need for the optoelectronic component obtainable by the method to be protected by an external protective diode.

Our optoelectronic component comprises a contact element having a carrier structure having a top side and a rear side situated opposite the top side, wherein at least one through contact opening extends between the top side and the rear side through the carrier structure. An insulation layer is arranged at the rear side. An electrically conductive material is arranged in the through contact opening. A solder metal is arranged at the rear side, the solder metal electrically conductively connecting to the electrically conductive material. A surface of the solder metal facing the insulation layer and the electrically conductive material is formed in a manner free of steps. Advantageously, the contact element provides external electrical contacts in this optoelectronic component. The through contact opening provides an electrically conductive connection between an external electrical contact of the optoelectronic component arranged at the rear side of the carrier structure and the top side of the carrier structure.

An optoelectronic semiconductor structure may be arranged at the top side. In the optoelectronic component, the optoelectronic semiconductor structure can advantageously be electrically contacted via the solder metal arranged at the rear side of the carrier structure of the optoelectronic component.

The above-described properties, features and advantages and the way in which they are achieved will become clearer and more clearly understood in association with the following description of examples explained in greater detail in association with the drawings.

FIG. 1 shows a schematic sectional side view of an auxiliary carrier 110. The auxiliary carrier 110 is formed as a thick and mechanically stable plate. The auxiliary carrier 110 can be present in the form of a wafer, for example.

The auxiliary carrier 110 can comprise sapphire, for example. Alternatively, however, the auxiliary carrier 110 can also comprise silicon or some other material.

A sacrificial layer 120 is arranged at a top side 111 of the auxiliary carrier 110. The sacrificial layer 120 forms, at the top side 111 of the auxiliary carrier 110, a thin layer having a thickness 121 measured perpendicularly to the top side 111, which thickness is generally smaller than the thickness of the auxiliary carrier 110. By way of example, the thickness 121 of the sacrificial layer 120 can be 100 nm to 1 μm.

The sacrificial layer 120 comprises a material that can be separated wet-chemically or by a laser beam in a later processing step. By way of example, the sacrificial layer 120 can comprise gallium nitride (GaN) or silicon nitride (SiN).

Figure 2:
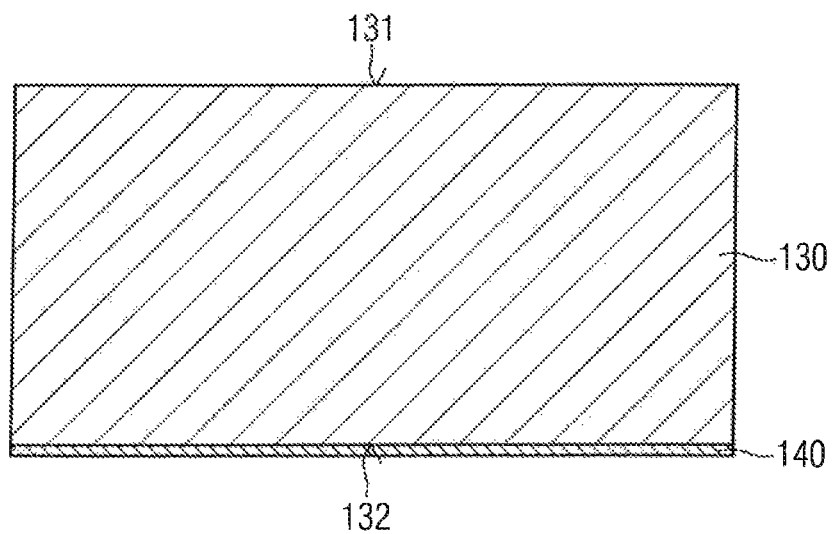
FIG. 2 shows a sectional side view of a carrier structure with an insulation layer.

FIG. 2 shows a schematic sectional side view of a carrier structure 130. The carrier structure 130 is present as a thick plate having a top side 131 and a rear side 132 situated opposite the top side 131. The carrier structure 130 can have the form of a wafer, for example.

The carrier structure 130 can comprise silicon (Si), for example. Alternatively, the carrier structure can also comprise some other material.

An insulation layer 140 is formed at the rear side 132 of the carrier structure 130. The insulation layer 140 comprises an electrically insulating material. By way of example, the insulation layer 140 can comprise silicon dioxide ($SiO_2$).

Figure 3:
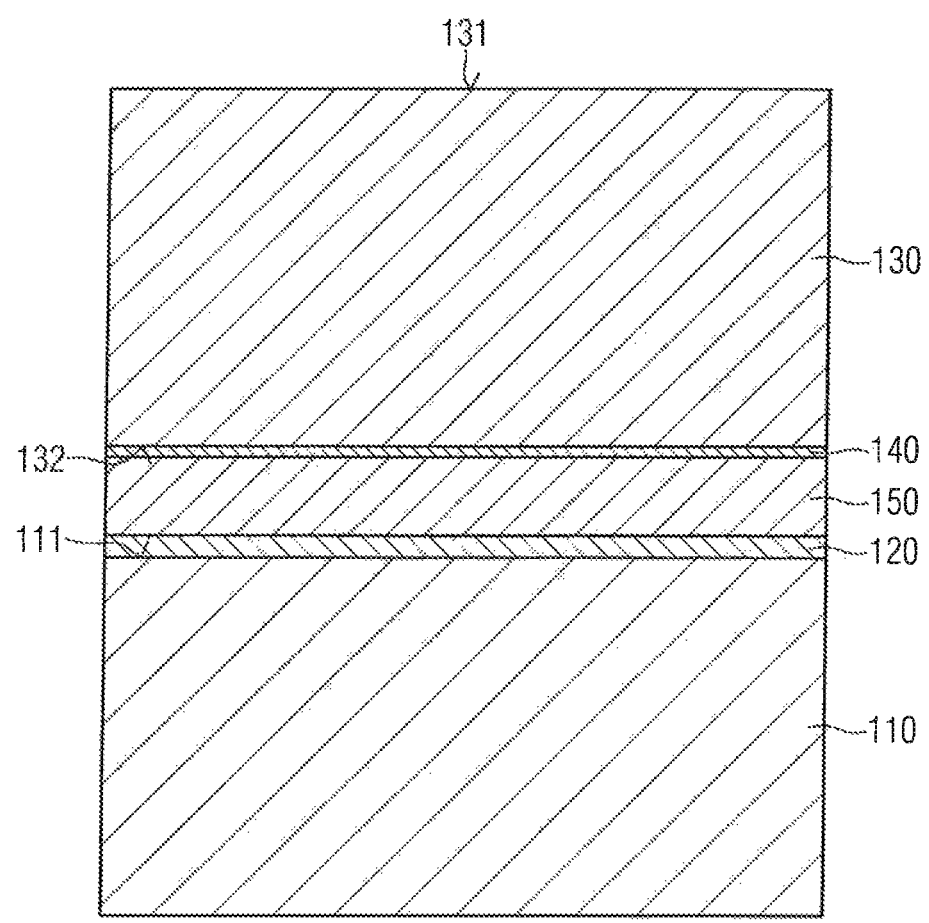
FIG. 3 shows the auxiliary carrier and the carrier structure after the process of connecting the sacrificial layer to the insulation layer.

FIG. 3 shows a schematic sectional side view of the auxiliary carrier 110 and the carrier structure 130. The sacrificial layer 120 arranged at the top side 111 of the auxiliary carrier 110 connects to the insulation layer 140 at the rear side 132 of the carrier structure 130 by an electrically conductive connection layer 150. The electrically conductive connection layer 150 can be formed, for example, as a eutectic solder connection. In this case, the connection between the insulation layer 140 arranged at the rear side 132 of the carrier structure 130 and the sacrificial layer 120 arranged at the top side 111 of the auxiliary carrier 110 may have been produced by eutectic bonding.

The sacrificial layer 120 arranged at the planar top side 111 of the auxiliary carrier 110 and the insulation layer 140 arranged at the planar rear side 132 of the carrier structure 130 are both formed such that they are planar and topography-free. This makes it possible to form the electrically conductive connection layer 150 with a very small thickness measured in a direction perpendicular to the top side 111 of the auxiliary carrier 110. By way of example, the electrically conductive connection layer 150 can be formed with a thickness of 100 nm.

Figure 4:
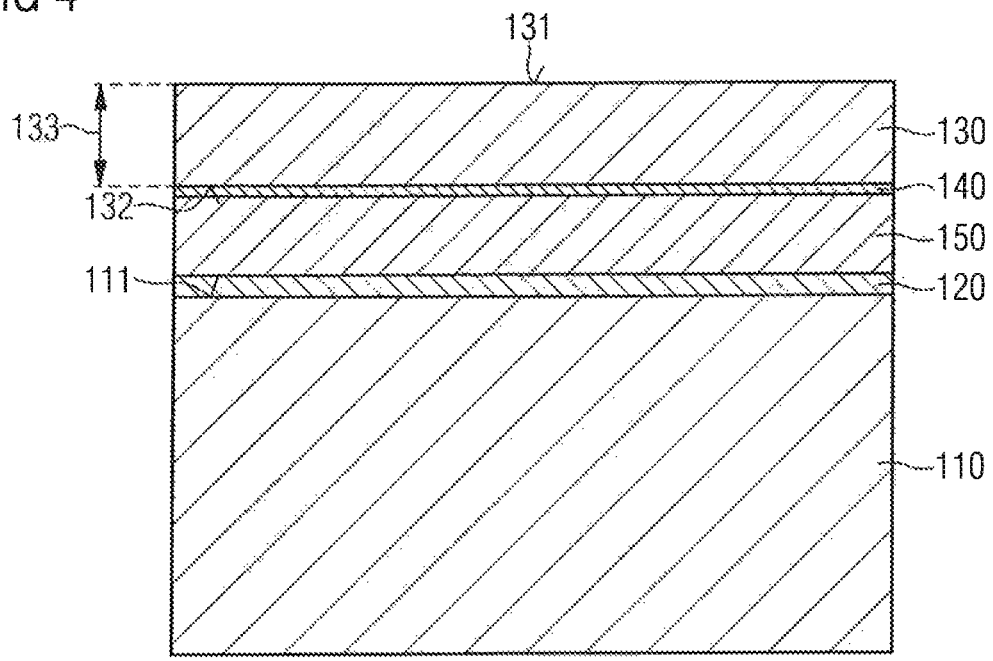
FIG. 4 shows the arrangement of first carrier and carrier structure after a process of thinning the carrier structure.

FIG. 4 shows a schematic sectional side view of the stack formed from the auxiliary carrier 110 and the carrier structure 130 after a processing step temporally succeeding the illustration in FIG. 3 has been carried out. In that processing step, the carrier structure 130 was thinned proceeding from its top side 131. It is possible for thinning of the carrier structure 130 to have been carried out, for example, by grinding the carrier structure 130.

After the carrier structure 130 has been thinned, it has a thickness 133 measured perpendicularly to the top side 131 and the rear side 132 of the carrier structure 130. The thickness 133 is preferably less than 200 µm. The thickness is particularly preferably less than 150 µm. Since the carrier structure 130 connects to the auxiliary carrier 110, the carrier structure 130 is mechanically stabilized by the auxiliary carrier 110 after the carrier structure 130 has been thinned.

Figure 5:
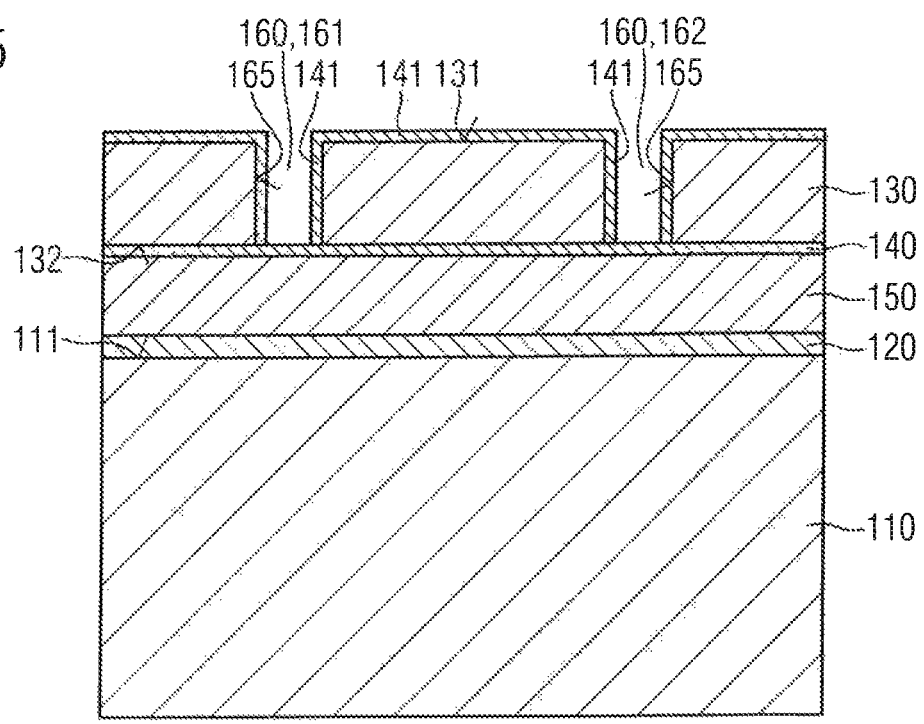
FIG. 5 shows the arrangement after a process of creating blind holes in the carrier structure.

FIG. 5 shows a schematic sectional side view of the stack formed by the auxiliary carrier 110 and the carrier structure 130 in a processing state temporally succeeding the illustration in FIG. 4. Blind holes 160 have been created in the carrier structure 130. A first blind hole 160, 161 and a second blind hole 160, 162 are visible in the excerpt from the stack as shown in FIG. 5. The blind holes 160 can also be referred to as TSVs (Through Silicon Via).

The blind holes 160 extend from the top side 131 of the carrier structure 130 in a direction substantially perpendicular to the top side 131 as far as the insulation layer 140 arranged at the rear side 132 of the carrier structure 130. The blind holes 160 can be created by an anisotropic etching process, for example, proceeding from the top side 131 of the carrier structure 130. In this case, the insulation layer 140 arranged at the rear side 132 of the carrier structure 130 can serve as an etching stop layer. This makes it possible to ensure that all the blind holes 160 created in the carrier structure 130 extend from the top side 131 of the carrier structure 130 exactly as far as the insulation layer 140 arranged at the rear side 132 of the carrier structure 130 and thus have the same depth.

After the process of forming the blind holes 160, a further insulation layer 141 was created at inner walls 165 of the blind holes 160 and also at the top side 131 of the carrier structure 130. The further insulation layer 141 comprises an electrically insulating material. The further insulation layer 141 may have been created by chemical vapor deposition, for example.

That part of the further insulation layer 141 arranged at the top side 131 of the carrier structure 130 can be made thicker than the insulation layer 140 at the rear side 132 of the carrier structure 130. This makes it possible to ensure that at least a thin layer of that part of the further insulation layer 141 arranged at the top side 131 of the carrier structure 130 is maintained during the process of opening—which follows in the next process step—the insulation layer 140 at the rear side 132 of the carrier structure 130. That part of the further insulation layer 141 arranged at the top side 131 of the carrier structure 130 can be made thicker, for example, by the fact that, in a first substep, first a part of the further insulation layer 141 is arranged only at the top side 131 of the carrier structure 130 and subsequently, in a second substep, a further part of the further insulation layer 141 is arranged at the inner walls 165 of the blind holes 160 and at the top side 131 of the carrier structure 130.

Figure 6:
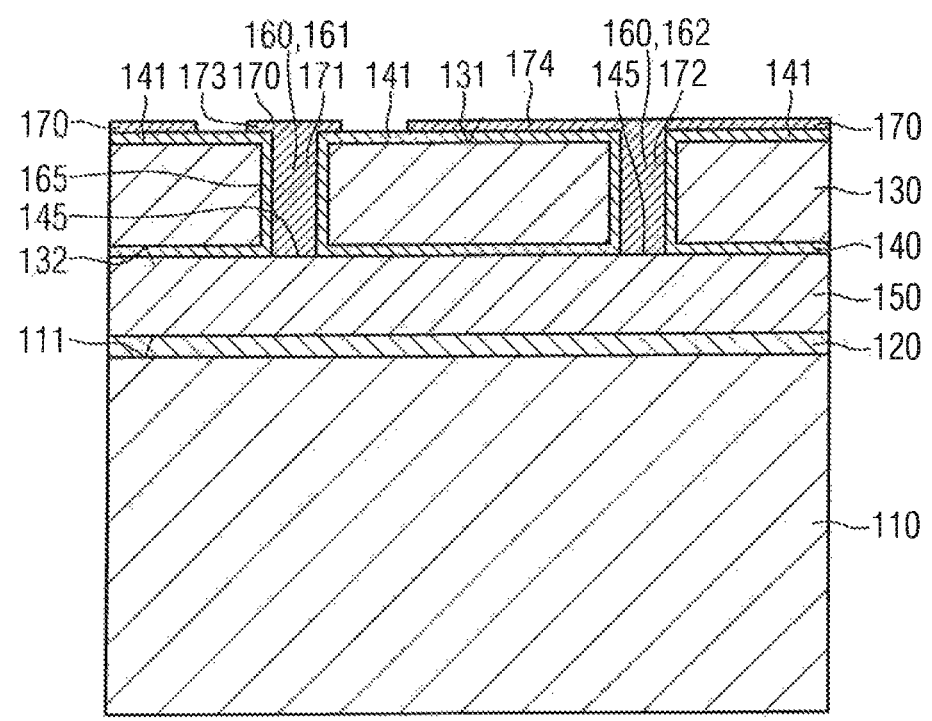
FIG. 6 shows the arrangement after the process of filling the blind holes with an electrically conductive material.

FIG. 6 shows a schematic sectional side view of the stack in a processing state temporally succeeding the illustration in FIG. 5. In a first processing step succeeding the illustration in FIG. 5, the insulation layer 140 was opened in the region of the blind holes 160, as a result of which openings 145 were produced in the insulation layer 140. The insulation layer 140 was removed in the regions exposed by the blind holes 160 such that the blind holes 160 now extend from the top side 131 of the carrier structure 130 as far as the electrically conductive connection layer 150.

In a subsequent processing step, an electrically conductive material 170 was deposited in the blind holes 160 and at the top side 131 of the carrier structure 130 and was patterned. The electrically conductive material 170 preferably comprises a metal.

In the first blind hole 161, the electrically conductive material 170 forms a first through contact 171. The electrically conductive material 170 of the first through contact 171 electrically conductively connects to the electrically conductive connection layer 150. In the second blind hole 162, the electrically conductive material 170 forms a second through contact 172. The electrically conductive material 170 of the second through contact 172 also electrically conductively connects to the electrically conductive connection layer 150.

At the top side 131 of the carrier structure 130, the electrically conductive material 170 forms a first contact region 173 and a second contact region 174. The first contact region 173 electrically conductively connects to the first through contact 171. The second contact region 174 electrically conductively connects to the second through contact 172. The first contact region 173 is separated from the second contact region 174. It is also possible for the contact regions 173, 174 to be formed from a different material than the through contacts 171, 172.

Since the electrically conductive material 170 is electrically insulated from the carrier structure 130 by the insulation layer 140 and the further insulation layer 141, there is no electrically conductive connection between the first through contact 171 and the second through contact 172, apart from via the electrically conductive connection layer 150.

Preferably, all the blind holes 160 of the carrier structure 130 are provided with through contacts formed by the electrically conductive material 170 and connect to a respective contact region formed by the electrically conductive material, all the contact regions being electrically isolated from one another. However, it would also be possible, for example, to connect two or more blind holes 160 to a common contact region.

Figure 7:
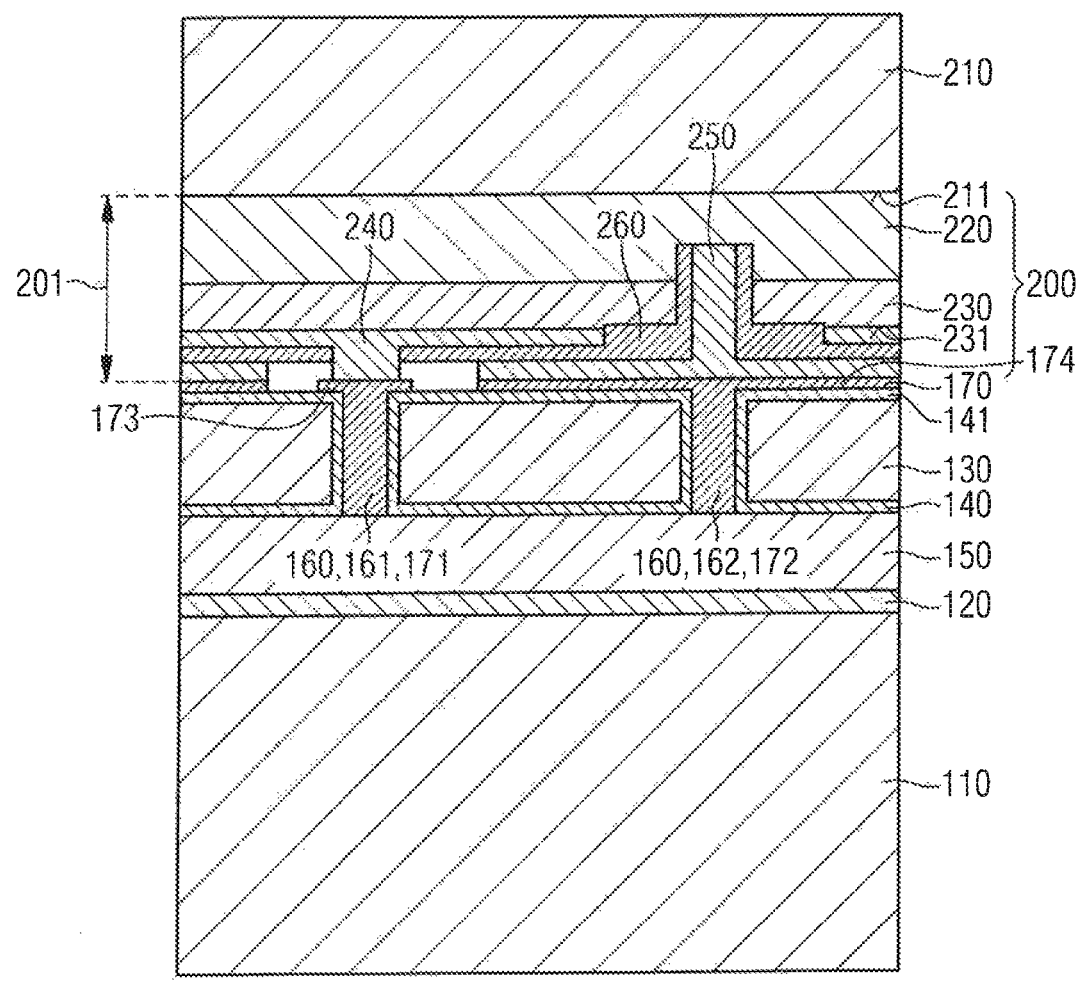
FIG. 7 shows the carrier structure and the auxiliary carrier after a process of connecting the carrier structure to an optoelectronic semiconductor structure arranged at a substrate.

FIG. 7 shows a schematic sectional side view of the stack formed by the auxiliary carrier 110 and the carrier structure 130 in a processing state temporally succeeding the illustration in FIG. 6. Moreover, FIG. 7 shows a schematic sectional side view of an optoelectronic semiconductor structure 200. The optoelectronic semiconductor structure 200 preferably emits electromagnetic radiation. The optoelectronic semiconductor structure 200 can be a light-emitting diode structure (LED), for example.

The optoelectronic semiconductor structure 200 is arranged at a top side 211 of a substrate 210 and will form a thin-film structure after detachment from the top side 211 of the substrate 210, the detachment being carried out at a later point in time. The substrate 210 can be present, for example, in the form of a wafer. The substrate 210 can comprise gallium arsenide (GaAs) or sapphire, for example.

The optoelectronic semiconductor structure 200 comprises an n-doped layer 220 and a p-doped layer 230. The n-doped layer 220 adjoins the top side 211 of the substrate 210. An active zone of the optoelectronic semiconductor structure 200 is formed between the n-doped layer 220 and the p-doped layer 230. A surface of the p-doped layer 230 facing away from the n-doped layer 220 forms a rear side 231 of the optoelectronic semiconductor structure 200. The order of the n-doped layer 220 and the p-doped layer 230 can also be chosen oppositely. The optoelectronic semiconductor structure 200 can also comprise further layers.

A first contact pad 240 and a second contact pad 250 are formed at the rear side 231 of the optoelectronic semiconductor structure 200. The first contact pad 240 and the second contact pad 250 are electrically insulated from one another by a second insulation layer 260. The first contact pad 240 electrically conductively connects to the p-doped layer 230 and can additionally serve as a mirror surface. The second contact pad 250 electrically conductively connects to the n-doped layer 220.

The optoelectronic semiconductor structure 200 has a thickness 201 in a direction perpendicular to the top side 211 of the substrate 210. The thickness 201 of the optoelectronic semiconductor structure 200 is preferably less than 20 µm, particularly preferably less than 10 µm.

If the substrate 210 is formed as a wafer, then a multiplicity of optoelectronic semiconductor structures 200 are preferably arranged alongside one another at the top side 211 of the substrate 210. In this case, each optoelectronic semiconductor structure 200 has a first contact pad 240 and a second contact pad 250.

During a processing step carried out between the processing states shown in FIGS. 6 and 7, the optoelectronic semiconductor structure 200 has been arranged at the top side 131 of the carrier structure 130 such that the first contact pad 240 of the optoelectronic semiconductor structure 200 electrically conductively connects to the first contact region 173 and the second contact pad 250 of the optoelectronic semiconductor structure 200 electrically conductively connects to the second contact region 174. The connection between the optoelectronic semiconductor structure 200 and the carrier structure 130 may have been carried out, for example, by a eutectic bonding process, in particular by a wafer-to-wafer bonding process.

Figure 8:
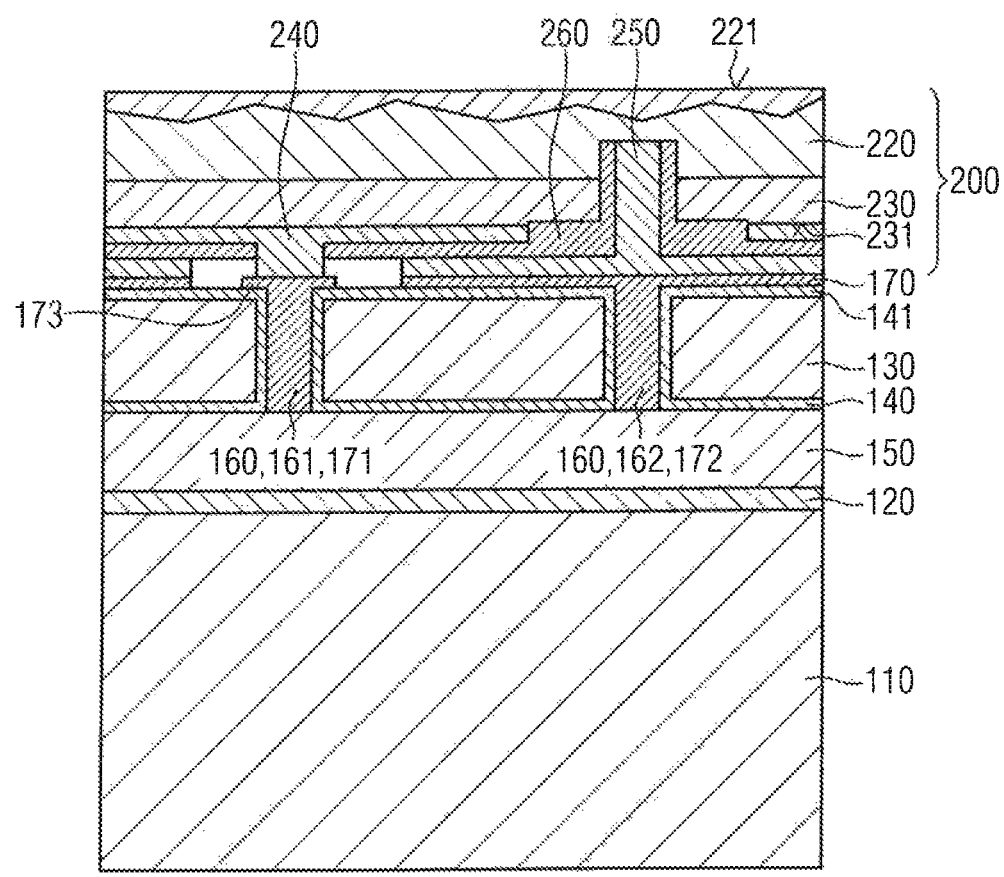
FIG. 8 shows the optoelectronic semiconductor structure connected to the carrier structure after a process of removing the substrate.

FIG. 8 shows the arrangement formed by the auxiliary carrier 110, the carrier structure 130 and the optoelectronic semiconductor structure 200 in a processing state temporally succeeding the illustration in FIG. 7. In processing processes carried out between the processing states shown in FIGS. 7 and 8, the substrate 210 has been detached from the optoelectronic semiconductor structure 200. The substrate 210 may have been detached by a laser lift-off process by a laser beam, for example. Afterward, the optoelectronic semiconductor structure 200 was processed to completion. A surface of the optoelectronic semiconductor structure 200 situated opposite the rear side 231 of the optoelectronic semiconductor structure 200 there forms a radiation emission face 221. The optoelectronic semiconductor structure 200 emits electromagnetic radiation at the radiation emission face 221.

Figure 11:
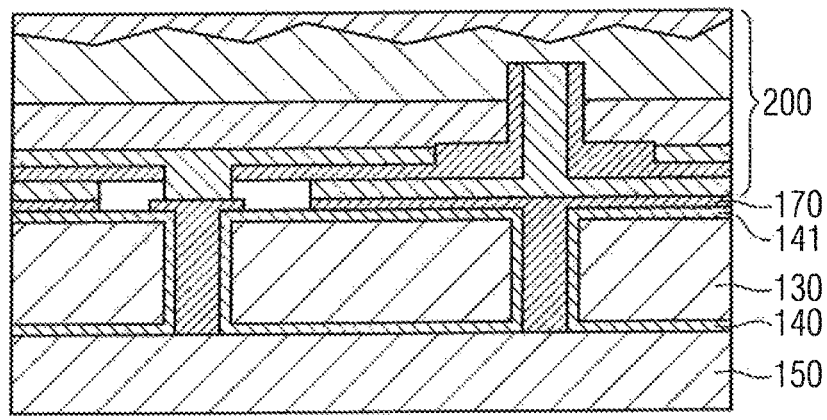
FIG. 11 shows a sectional side view of the arrangement of carrier structure and optoelectronic semiconductor structure after a process of detaching the auxiliary carrier.

In a processing step temporally succeeding the processing state shown in FIG. 8, the auxiliary carrier 110 is detached from the electrically conductive connection layer 150 and connected to the carrier structure 130 by a process of separating the sacrificial layer 120. FIG. 11 shows a schematic sectional side view of the arrangement formed by the carrier structure 130 and the optoelectronic semiconductor structure after the auxiliary carrier 110 has been detached.

Figure 9:
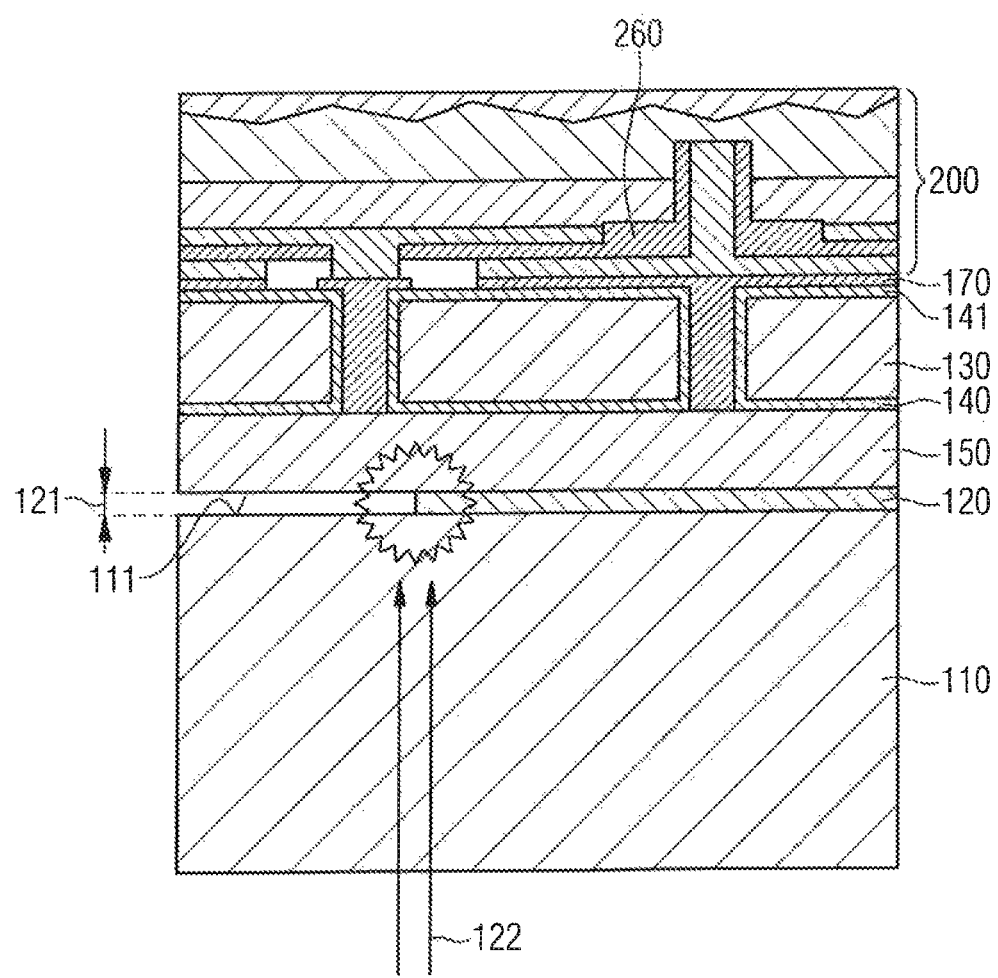
FIG. 9 shows a schematic side view of the arrangement during a process of separating the sacrificial layer by a first method.

Separating the sacrificial layer 120 can be carried out by a laser beam 122, for example, as illustrated schematically in the sectional side view in FIG. 9. For this purpose, a laser beam 122 is directed through the auxiliary carrier 110 onto the sacrificial layer 120 and destroys the sacrificial layer 120. Preferably, the auxiliary carrier 110 comprises an optically transparent material, for example, sapphire. In this case, the sacrificial layer 120 can comprise gallium nitride (GaN) or silicon nitride (SiN). The thickness 121 of the sacrificial layer 120 is preferably 100 nm to 500 nm, particularly preferably 200 nm to 300 nm.

Figure 10:
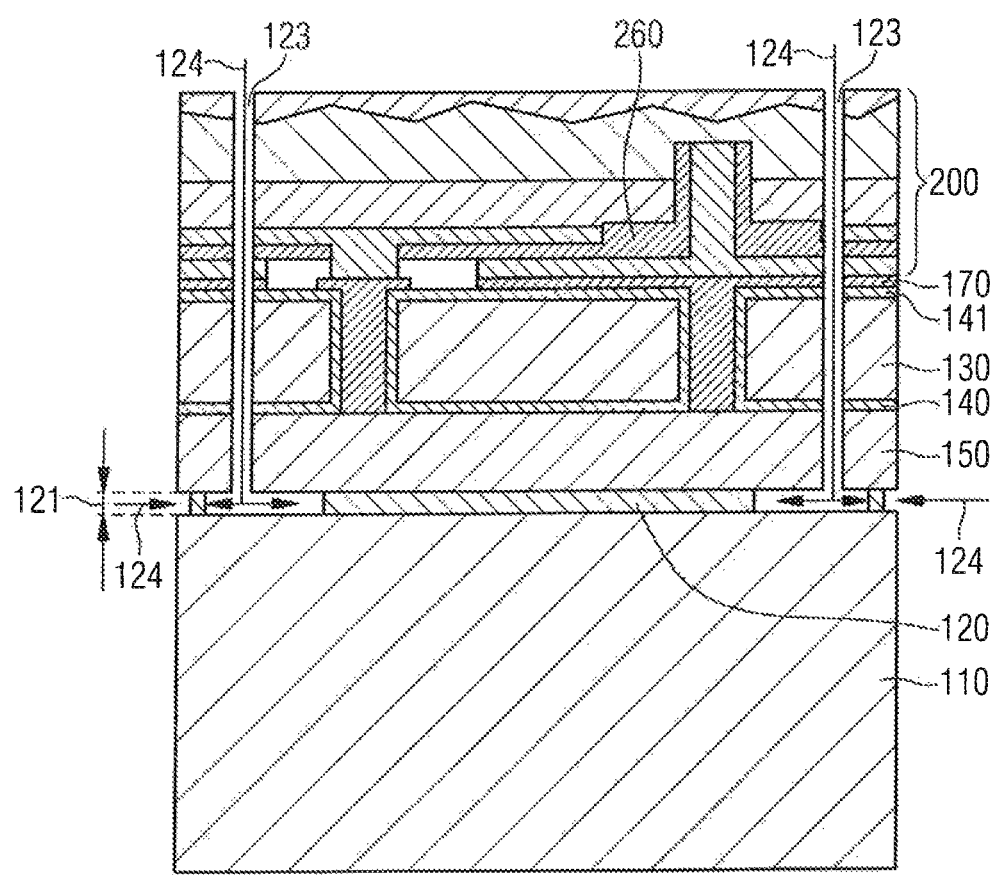
FIG. 10 shows a sectional side view of the arrangement during a process of separating the sacrificial layer according to a second method.

Alternatively, the sacrificial layer 120 can also be separated by a wet-chemical treatment as illustrated schematically in the sectional side view in FIG. 10. For this purpose, an etching medium 124 is guided to the sacrificial layer 120 and chemically decomposes the sacrificial layer 120. Channels 123 extending through the optoelectronic semiconductor structure 200, the carrier structure 130 and the electrically conductive connection layer 150 to the sacrificial layer 120 can be provided to feed the etching medium 124 to the sacrificial layer 120. $H_3PO_4$, for example, can be used as etching medium 124. In this case, the sacrificial layer 120 preferably comprises gallium nitride (GaN). The thickness 121 of the sacrificial layer 120 is preferably more than 300 nm, particularly preferably more than 500 nm.

Separating the sacrificial layer 120 for the purpose of detaching the auxiliary carrier 110 can also be carried out by some other method.

Figure 12:
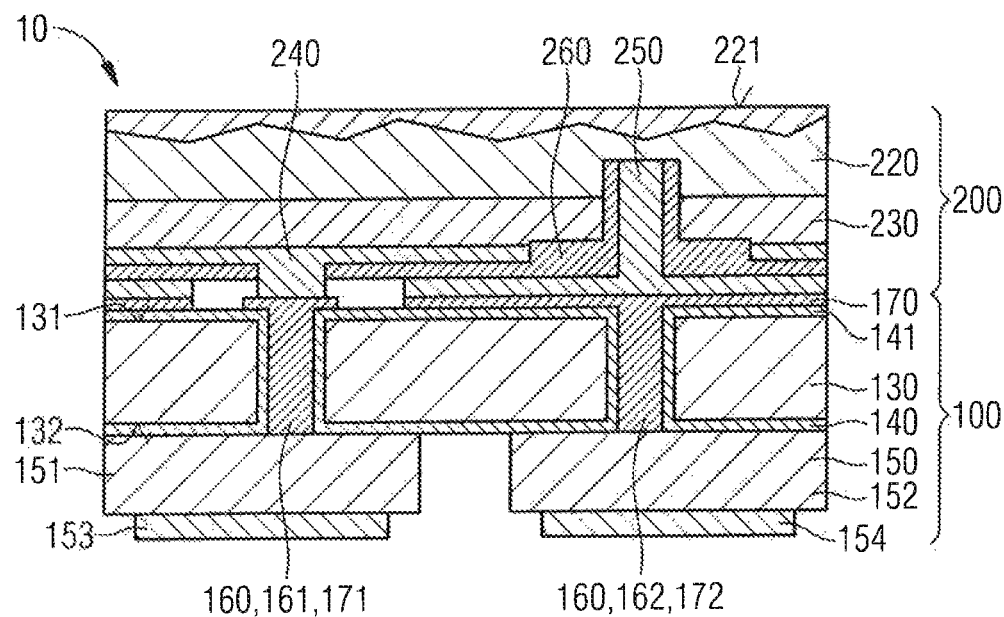
FIG. 12 shows a sectional side view of a first optoelectronic component.

FIG. 12 shows a schematic sectional side view of an optoelectronic component 10 formed by further processing from the arrangement illustrated in FIG. 11. In a processing step temporally succeeding the illustration in FIG. 11, first the electrically conductive connection layer 150 was patterned. In this case, a first section 151 and a second section 152, electrically insulated from the first section 151, were formed from the electrically conductive connection layer 150. The electrically conductive connection layer 150 may have been patterned, for example, wet-chemically or dry-chemically or by severing the electrically conductive connection layer 150 in a laser process.

The first section 151 formed from the electrically conductive connection layer 150 electrically conductively connects to the electrically conductive material 170 of the first through contact 171 and, via the first contact region 173, also to the first contact pad 240 of the optoelectronic semiconductor structure 200. The second section 152 formed from the electrically conductive connection layer 150 electrically conductively connects to the electrically conductive material 170 of the second through contact 172 and, via the second contact region 174, to the second contact pad 250 of the optoelectronic semiconductor structure 200.

In a further processing step temporally succeeding the illustration in FIG. 11, a first soldering contact pad 153 was applied to the first section 151 formed from the electrically conductive connection layer 150 and a second soldering contact pad 154 was applied to the second section 152 formed from the electrically conductive connection layer 150. The first section 151 formed by the electrically conductive connection layer 150 produces an electrically conductive connection between the first soldering contact pad 153 and the electrically conductive material 170 of the first through contact 171. The second section 152 formed by the electrically conductive connection layer 150 produces an electrically conductive connection between the second soldering contact pad 154 and the electrically conductive material 170 of the second through contact 172. The first soldering contact pad 153 and the second soldering contact pad 154 comprise an electrically conductive material suitable for an electrical contacting of the component by soldering onto a circuit board. By way of example, the soldering contact pads 153, 154 can comprise copper.

The carrier structure 130 with the through contacts 171, 172 extending through the carrier structure 130 and with the soldering contact pads 153, 154 arranged at the rear side 132 of the carrier structure 130 and electrically conductively connected to the through contacts 171, 172 forms a contact element 100. The soldering contact pads 153, 154 provide electrically conductive connections to the contact pads 240, 250 of the optoelectronic semiconductor structure 200 of the optoelectronic component 10 and are arranged at the opposite side of the optoelectronic component 10 relative to the radiation emission face 221 of the optoelectronic semiconductor structure 200. The optoelectronic component 10 is thus suitable, for example, as an SMD component for surface mounting. In this case, the soldering contact pads 153, 154 of the optoelectronic component 10 can be contacted by reflow soldering, for example.

The optoelectronic component 10 has a small thickness in a direction perpendicular to the radiation emission face 221 of the optoelectronic semiconductor structure 200 of the optoelectronic component 10, the thickness substantially corresponding to the sum of the thickness 133 of the carrier structure 130 and the thickness 201 of the optoelectronic semiconductor structure 200.

The rear side 132 of the carrier structure 130 of the contact element 100 of the optoelectronic component 10 is very planar since the rear side 132 of the carrier structure 130 has not been processed by a grinding process during the production of the optoelectronic component 10. The electrically conductive material 170 arranged in the blind holes 160 of the carrier structure 130 of the contact element 100 of the optoelectronic component 10, at the transition with the sections 151, 152 of the electrically conductive connection layer 150, terminates substantially flush with the insulation layer 140 at the rear side 132 of the carrier structure 130. That surface of the sections 151, 152 of the electrically conductive connection layer 150 facing the carrier structure 130 is thus likewise planar and in a manner free of steps. The electrically conductive connection layer 150 does not extend into the blind holes 160.

If the auxiliary carrier 110, the carrier structure 130 and the substrate 210 have been provided in the form of wafers, then a multiplicity of optoelectronic components 10 can be produced in parallel by the method steps described above, the optoelectronic components all being formed substantially identical and being arranged alongside one another continuously in a direction parallel to the radiation emission face 221. In this case, a further method step of dividing the carrier structure 130 and the optoelectronic semiconductor structure 200 can be carried out to separate the individual optoelectronic components 10 from one another.

Figure 13:
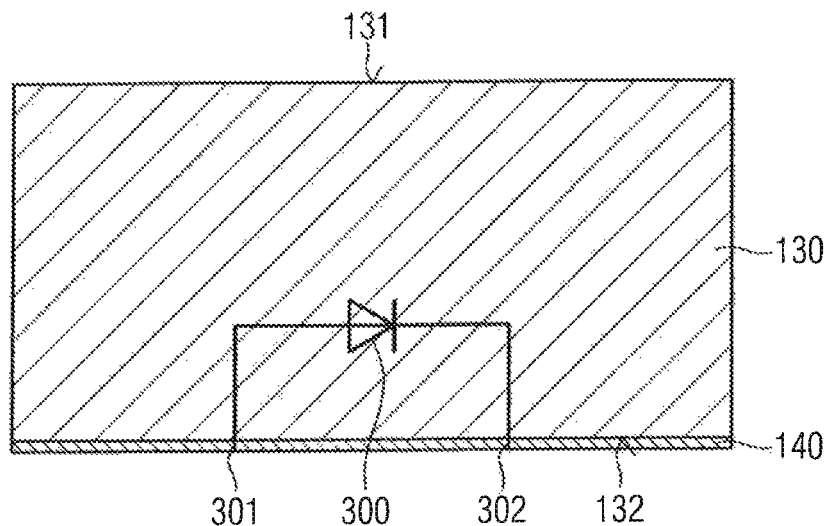
FIG. 13 shows a sectional side view of a carrier structure with an integrated protective diode.

FIG. 13 shows a schematic sectional side view of an alternative example of the carrier structure 130. In the example shown in FIG. 13, the carrier structure 130 has an integrated protective diode 300, illustrated merely symbolically in FIG. 13. The integrated protective diode 300 may have been integrated into the carrier structure 130 by methods of semiconductor processing. The integrated protective diode 300 has a first contact 301 and a second contact 302. The first contact 301 and the second contact 302 of the integrated protective diode 300 are accessible at the rear side 132 of the carrier structure 130. The insulation layer 140 arranged at the rear side 132 of the carrier structure 130 has openings or interruptions suitable for this purpose.

Figure 14:
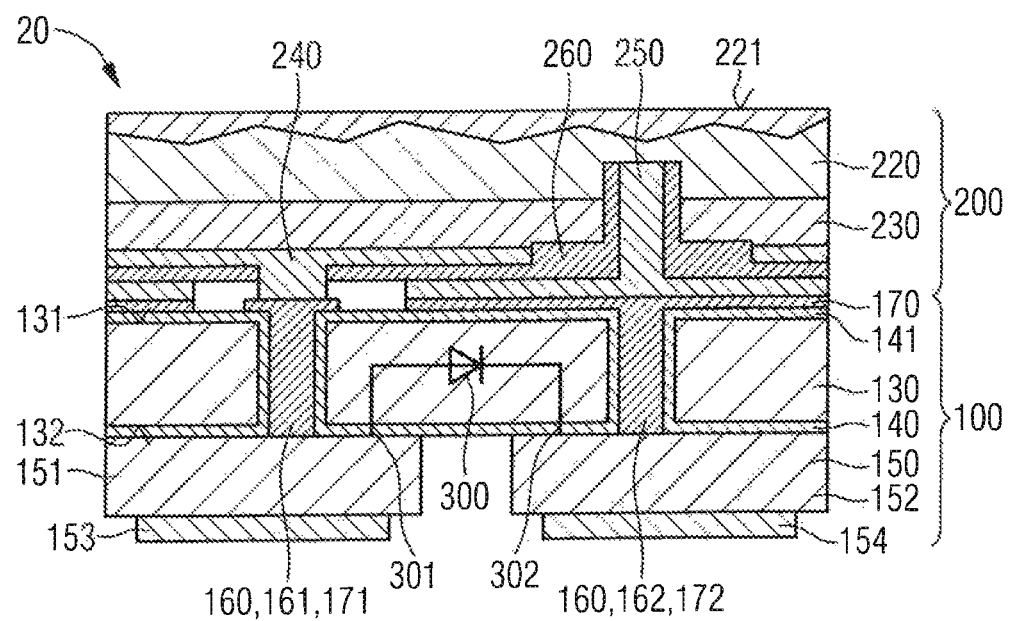
FIG. 14 shows a sectional side view of a second optoelectronic component.

FIG. 14 shows a schematic sectional side view of an optoelectronic component 20 obtainable if the example of the carrier structure 130 shown in FIG. 13 is used in the production method explained with reference to FIGS. 1 to 12. The optoelectronic component 20 in FIG. 14 differs from the optoelectronic component 10 in FIG. 12 in that the protective diode 300 is integrated into the carrier structure 130 of the contact element 100 of the optoelectronic component 20. The first contact 301 of the integrated protective diode 300 electrically conductively connects to the first section 151 formed from the electrically conductive connection layer 150 and thus also to the first contact pad 240 of the optoelectronic semiconductor structure 200. The second contact 302 of the integrated protective diode 300 electrically conductively connects to the second section 152 formed from the electrically conductive connection layer 150 and thereby also to the second contact pad 250 of the optoelectronic semiconductor structure 200.

Consequently, the integrated protective diode 300 electrically connects antiparallel with the optoelectronic semiconductor structure 200 of the optoelectronic component 20. The integrated protective diode 300 can serve as an ESD protective diode to protect the optoelectronic semiconductor structure 200 of the optoelectronic component 20 against damage resulting from electrostatic discharges.

Our components and methods have been illustrated and described in greater detail on the basis of the preferred examples. Nevertheless, this disclosure is not restricted to the examples. Rather, other variations can be derived therefrom by those skilled in the art without departing from the scope of protection of the disclosure.

This application claims priority of DE 10 2013 221 788.9, the subject matter of which is incorporated herein by reference.

The invention claimed is:

1. A method of producing a contact element for an optoelectronic component comprising in this order:
    providing an auxiliary carrier with a sacrificial layer arranged on a top side of the auxiliary carrier;
    providing a carrier structure having a top side and a rear side situated opposite the top side, wherein an insulation layer is arranged at the rear side of the carrier structure;
    connecting the sacrificial layer to the insulation layer by an electrically conductive connection layer;
    creating at least one blind hole extending from the top side of the carrier structure as far as the insulation layer;
    opening the insulation layer in a region of the at least one blind hole;
    arranging an electrically conductive material in the at least one blind hole;
    detaching the auxiliary carrier by separating the sacrificial layer; and
    patterning the electrically conductive connection layer.

2. The method as claimed in claim 1, wherein the auxiliary carrier and the carrier structure are wafers.

3. The method as claimed in claim 1, wherein the auxiliary carrier comprises sapphire or silicon.

4. The method as claimed in claim 1, wherein the carrier structure comprises silicon.

5. The method as claimed in claim 1, wherein the sacrificial layer comprises gallium nitride or silicon nitride.

6. The method as claimed in claim 1, wherein the sacrificial layer and the insulation layer connect by eutectic bonding.

7. The method as claimed in claim 1, further comprising, after connecting the sacrificial layer to the insulation layer, thinning the carrier structure proceeding from a top side of the carrier structure.

8. The method as claimed in claim 7, wherein the carrier structure is thinned to a thickness of less than 200 µm.

9. The method as claimed in claim 1, further comprising, before opening the insulation layer in the region of the at least one blind hole, forming a further insulation layer at an inner wall of the blind hole and at the top side of the carrier structure.

10. The method as claimed in claim 1, wherein separating the sacrificial layer is carried out by an etching process or a laser beam.

11. The method as claimed in claim 1, wherein the electrically conductive connection layer is patterned to form sections of the electrically conductive connection layer that are electrically insulated from one another.

12. The method as claimed in claim 1, further comprising, after patterning the electrically conductive connection layer, applying at least one soldering contact pad to the electrically conductive connection layer.

13. A method of producing an optoelectronic component comprising:

producing a contact element according to a method as claimed in claim 1, before detaching the auxiliary carrier, providing a substrate with an optoelectronic semiconductor structure arranged at a top side of the substrate;

arranging the optoelectronic semiconductor structure at the top side of the carrier structure; and detaching the substrate.

14. The method as claimed in claim 13, wherein the substrate is a wafer.

15. The method as claimed in claim 13, wherein the optoelectronic semiconductor structure has a thickness of less than 20 µm.

16. The method as claimed in claim 13, wherein the optoelectronic semiconductor structure is arranged at the top side of the carrier structure by eutectic bonding.

17. The method as claimed in claim 13, further comprising dividing the carrier structure and the optoelectronic semiconductor structure to obtain a plurality of optoelectronic components.

18. The method as claimed in claim 13, wherein the carrier structure is provided with an integrated protective diode.

* * * * *